United States Patent [19]

Bentz et al.

[11] Patent Number: 4,654,625
[45] Date of Patent: Mar. 31, 1987

[54] ELECTRONIC CONTROL UNIT STRUCTURE

[75] Inventors: Willy Bentz, Sachsenheim; Gert Jakob, Stuttgart, both of Fed. Rep. of Germany

[73] Assignee: Robert Bosch GmbH, Stuttgart, Fed. Rep. of Germany

[21] Appl. No.: 734,852

[22] Filed: May 16, 1985

[30] Foreign Application Priority Data

May 25, 1984 [DE] Fed. Rep. of Germany ....... 3419539

[51] Int. Cl.$^4$ ............................................ H01C 10/32
[52] U.S. Cl. .................................... 338/164; 338/163; 338/135
[58] Field of Search ............... 338/184, 185, 199, 163, 338/164, 166, 168, 144, 135

[56] References Cited

U.S. PATENT DOCUMENTS 3,184,697  5/1965  Sargent ........................... 338/164 X
3,373,395  3/1968  Sargent ............................. 338/164

Primary Examiner—E. A. Goldberg
Assistant Examiner—M. M. Lateef
Attorney, Agent, or Firm—Frishauf, Holtz, Goodman & Woodward

[57] ABSTRACT

To permit external adjustment of a potentiometer (3) having an adjustment head (4), and located within a sealed housing (1), while permitting placement of an adjustment insert (7) from the outside of the housing through a bore (6) thereof, and compensate for manufacturing and positioning tolerances, the insert element is a unitary structure of a tough plastic, such as polyamide (nylon), sealingly inserted through the opening and retained in the opening by snap-over hooks (13) engaging over the inner wall (25) of the housing, and retaining a screw head (8) of the insert element therein. Longitudinal and transverse deviation from alignment of the axis of the opening (6) and the rotation axis of the adjustment element (4) of the potentiometer is obtained by resiliently deflectable cross-joints (14, 14'; 17, 18) formed in an intermediate portion of the insert element, which cross-joints are connected by a S-shaped resiliently deflectable connecting portion. The end (19) of the insert element, fitting against the adjustment portion (4) of the potentiometer, and/or a screwdriver blade-like engagement blade (24) are preferably formed with self-aligning engagement surfaces (20) to permit self-seeking positioning of engagement of the insert with the potentiometer in spite of possible initial, or later misalignment due to tolerances.

11 Claims, 4 Drawing Figures

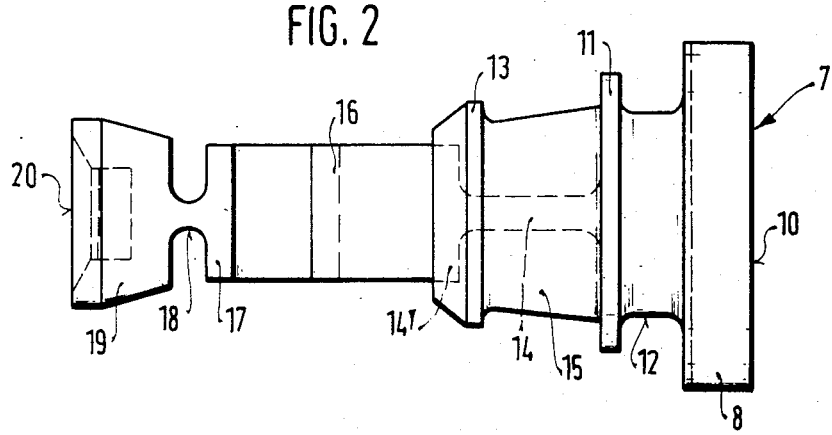
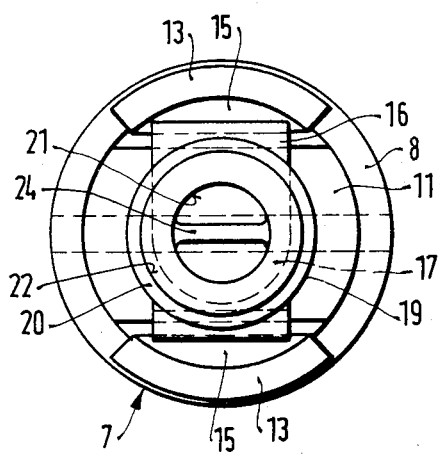

ELECTRONIC CONTROL UNIT STRUCTURE

The present invention relates to an electronic control unit structure and more specifically to a structure which can be entirely sealed, yet contains an externally accessible adjustment knob to permit adjustment of an adjustable element within the sealed structure without, however, impairing the sealing of the structure.

BACKGROUND

Various electronic structures must be retained in sealed state or condition within a housing so that the structure is isolated from it's surroundings, and thus isolated from ambient contamination, for example, by atmospheric contamination, humidity, salt spray or the like. A typical application is an electronic control unit enclosed within a housing and installed in a motor vehicle, where changes in ambient humidity, mineral, salt or other contamination of surrounding atmosphere, oil sprays or gasoline vapors, and the like may attack delicate electronic components. The electronic components within the housing may include an adjustable element, such as a potentiometer which must have an externally accessible adjustment part, for example, an adjustment screw, knob, screwhead or the like. Yet, the potentiometer should preferably form part of the sealed structure and preferably be entirely retained within the interior of the housing.

It has been proposed to provide a potentiometer, located on a suitable support which, for example, may be a printed circuit-board (PC board), with an externally projecting adjustment element passing through a bore or opening in the housing. The potentiometer structure, as a unit, or block, must then be fitted precisely within the opening in the housing and tolerances must be compensated-for by flexible seals. Usually, it is possible to deflect the structure or block of which the potentiometer is a part only in a direction perpendicular to the longitudinal axis thereof.

It is quite difficult to mount a PC board with a potentiometer thereon within the housing; particularly, if the potentiometer is a center-type adjustment potentiometer, it may be difficult to introduce the positioning element thereof into the suitable opening of the housing. Unless extreme care is taken, and tolerances are held to a close level, the potentiometer may be damaged upon introduction thereof into the housing. Potentiometers which use coiled wires cannot be adjusted with known adjustment elements since longitudinal tolerances cannot be compensated thereby, but, rather, mechanical pressure may unduly influence the electrical characteristics of the potentiometer. An adjustment device for a coiled-wire potentiometer about which a slider operates has been proposed which adjustment element is held on the inside of the housing by an additional element or part and includes an externally accessible operating or control stud or plug or bolt. The externally accessible and externally adjustable bolt has, at one end thereof, a wave or undulating leaf spring which is releasable secured thereto, the other end of which releasably carries the adjustment screw of the potentiometer. The leaf spring transfers rotary movement between the plug and bolt of the potentiometer. Assembly continues to be complex, however, and the three-part arrangement—potentiometer, leaf spring, adjustment bolt or plug—is a substantial disadvantage. The spacing between the potentiometer and the adjustment bolt or plug must be precisely maintained so that the spring is neither over loaded, nor the potentiometer unduly affected by mechanical loading, thereby, again, impairing the accuracy of adjustment and of the electrical characteristics of the potentiometer.

THE INVENTION

It is an object to improve an electronic control unit within a sealed housing, by providing an externally accessible adjustment element for an internally located adjustable component, typically a potentiometer, which is easily installed, does not place any strain on the potentiometer and can readily be made while compensating for manufacturing and/or placement tolerances of the potentiometer within the housing, as well as for tolerances of the housing structure itself. This is particularly important if the housing structure is made, at least in part, of cast, or of extruded metal, or of plastic, since tolerances in such structures are difficult to maintain. Further, the adjustment element should be capable of compensating for any tolerances, or changes in dimensions of the housing surrounding the adjustment element, for example, under the influence of heat.

Briefly, a housing structure is formed with an opening through which an adjustment element extends which is formed as a unitary insert structure having a plug or bolt-like body which is insertable in the opening from the outside of the housing, and formed with means for rotatably retaining the bolt or plug-like body in the opening formed in the wall of the housing. Such means may, for example, be snap-hooks, resiliently deflectable upon insertion of the plug element from the outside of the housing and snapping over an inner edge of the wall, the plug element being sealed through the opening by a suitable sealing ring such as a O-ring. The plug element further includes an elastic deformable compensating portion which is resiliently deflectable longitudinally as well as transversely with respect to the longitudinal axis of the plug or bolt-like body portion, and further transversely and longitudinally with respect to a longitudinal axis of an adjustment portion. The end of the adjustment portion is formed with a portion engaging an adjustment screw or knob of a potentiometer, for example, being cup-like with an inwardly projecting rib to engage a screwdriver slot of an adjustment screw of the potentiometer which is surrounded by the cup-like portion. Preferably the edges of the cup-like portion are tapered inwardly, in funnel-like form so that self-alignment of the insert element, upon insertion through the opening of the hole of the housing will be inherently obtained.

The structure has the advantage that the unitary, single-element adjustment or insert structure is provided which can be inserted through the opening in the wall of the sealed housing after assembly of a PC board therein, with the location of the potentiometer only approximately matching the opening in the housing. Thus, all assembly operations can be carried out without attention to close tolerances, and the externally accessible adjustment element is introduced only after the PC board is located within the housing and the housing is sealed. By introducing the unitary insert structure from the outside, the insert structure then sealing and locking within the opening, precise alignment of the potentiometer is not needed while the sealed characteristics of the housing is retained. The cup-shaped end portion will automatically engage the screw-head like adjustment portion of the potentiometer, and the internal rib thereof will engage in the screwdriver-type slot formed in the adjustment head of the potentiometer. Manufacturing and placement tolerances in the longitudinal direction of the adjustment screw, as well as extending transversely to the axis of rotation of the adjustment screw and/or the unitary insert element are compensated by the intermediate resilient portion thereof.

In accordance with the preferred feature of the invention, the intermediate resilient portion is generally S-shaped. This is particularly desirable in combination with the funnel shaped, or inwardly tapering end portion of the cup surrounding the potentiometer adjustment screw.

DRAWING

FIG. 2 is a side view of the insert;

FIG. 3 is a view of the insert in the direction of the arrow III—III in FIG. 1; and FIG. 4 is a section through the insert element only and taken along section line IV—IV of FIG. 1.

DETAILED DESCRIPTION

Figure 1:
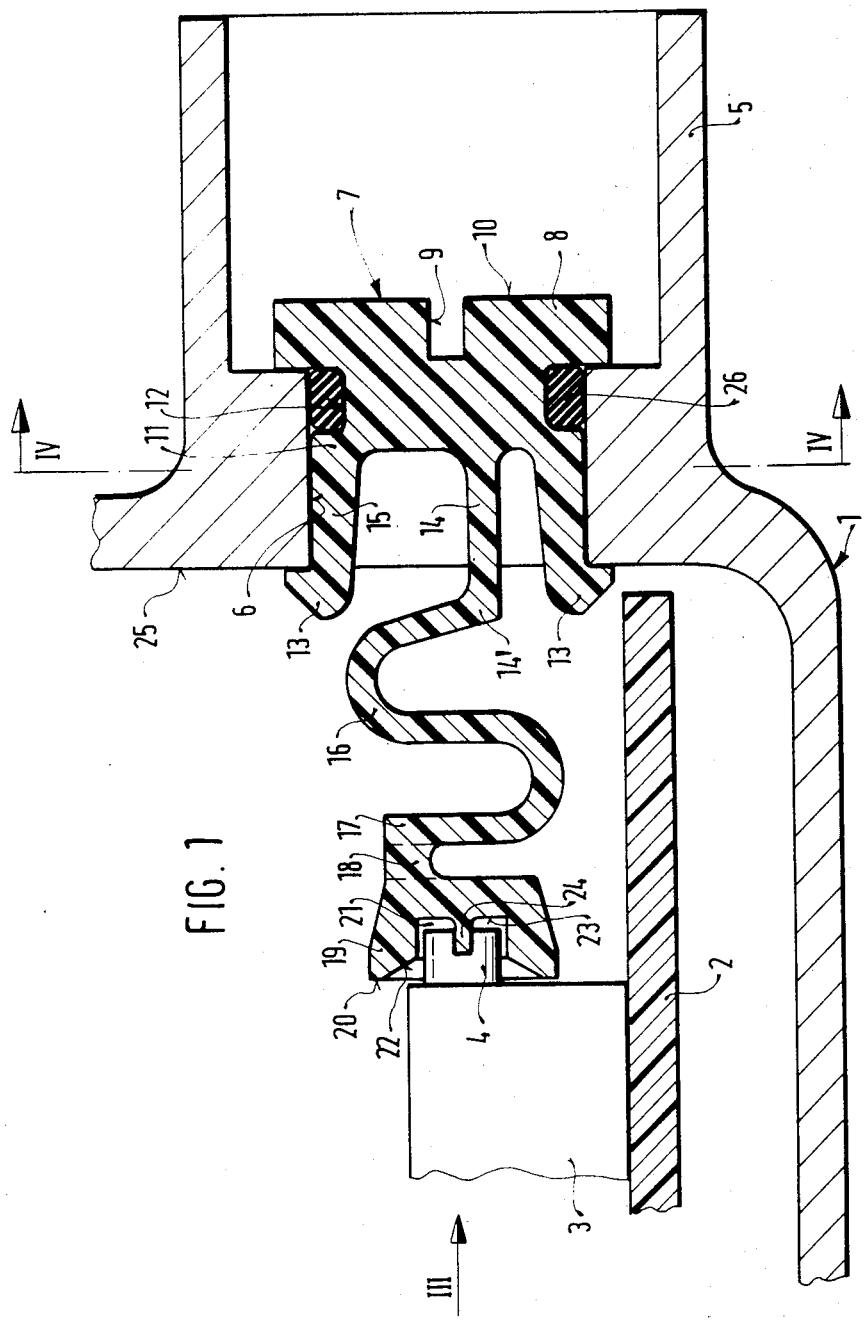
FIG. 1 is a fragmentary longitudinal sectional view through a housing for an electronic structure, illustrating that portion which retains an adjustable potentiometer, and the insert element to permit its adjustment.

Housing 1 of an electronic control unit, typically suitable for installation in an automotive vehicle, or in any other area where it may be subjected to a potentially, or actually contaminated environment, is sealed and retains therein a printed circuit (PC) board 2. The housing structure itself and the PC board 2, as well as the components thereon are conventional and, therefore, are shown only in fragmentary and schematic representation. The PC board 2 has conductors located thereon, not shown, and, further, various electronic components such as transistors or the like, interconnected by the respective conductive tracks or conductors formed on the PC board. The arrangement and the circuit form no part of the present invention and may be conventional. One of the electronic components is a potentiometer 3 which, for example, may be a coiled-wire rotary adjustable potentiometer. The potentiometer 3 has a projecting adjustment screw, terminating in a screw head 4, formed with a screwdriver-like slit to permit adjustment of the potentiometer 3.

The housing 1 is formed with a protective cover eye 5 surrounding a circular bore or opening 6. A unitary insert element or structure 7 extends through the bore 6 sealed with respect to the outside, to form an adjustment element for the potentiometer 3. The insert 7, preferably, is made of plastic and a particularly suitable plastic is a tough, yet elastically deformable, tenacious material, such as, for example, polyamide. The insert element 7 has an outer end portion 8 formed with a slit 9 at its facing end surface 10, to permit engagement by a screwdriver. The head 8 is joined by a cylindrical plug or bolt-like sealing portion 11 of smaller diameter fitting within the bore or opening 6 in the wall of the housing 1. The diameter of the cylindrical sealing portion 11 is less than that of the head 8. The cylindrical portion 11 is formed with a circular groove 12 within which any other similar sealing material and sealing ring is located. The cylindrical portion 11 is undercut and terminates in two resiliently deflectable engagement snap hooks 13. The central undercut portion terminates in a narrow strip 14—see FIG. 4. The snap hooks 13 have a hook shaft 15 with an outer part—circular shape, matching the curve of the bore 6.

The rib or strip 14 is part of a first cross-joint, which merges with a unitary portion 14' and, beyond the portion 14', with a S-shaped intermediate portion 16. The intermediate portion 16 terminates in an end portion 17 which forms part of a second cross-joint, the other element of which is formed by a narrow strip 18 extending transversely to the end 17 of the intermediate portion 16.

The strip or rib 18 merges with a rotation-symmetrical position element or portion 19, which, generally, is cup shaped. The positioning portion 19 has an end face 20 which is formed with a blind opening 21. The blind opening 21, at its end, is funnel-shaped, as best seen at 22, tapering inwardly. The bottom surface 23 of the opening 21 is formed with a strip or rib 24 which is dimensioned and shaped to engage, in form of a screwdriver blade, in the slot formed in the adjustment heads 4 of the potentiometer 3. The strip or rib or blade 24 extends in outward direction from the bottom 23 of the opening 21.

The insert 7 forms a unitary adjustment element for the potentiometer 3 which can be inserted from the outside into the housing 1, and rotatably retained therein.

ASSEMBLY

The PC board 2, with the potentiometer 3 and all other elements thereon, is secured within the housing 1 in any suitable and well known manner, and securely mounted therein. The adjustment head 4 of the potentiometer 3 is aligned with the central axis of the opening 6—subject to such manufacturing tolerances as may occur. After placement of the PC board 2, and the components in the housing, the housing is then completely sealed, except for the opening 6, which is left open. The opening 6 may be used as a test opening for the seal. After the housing has been sealed, to be tight with respect to ambient conditions, primarily humidity and attack by corrosive atmospheres, the insert 7 is pushed through the bore 6. The snap hooks 13 are deflected inwardly towards the strip 14 until the screw head 8 of the insert element 7 has been pressed so far into the bore 6 that the snap hooks 13 snap outwardly over the inner wall 25 of the housing 1. Thus, the insert 7 is securely held within the housing. The sealing ring 26, previously inserted into the groove 12 of the insert 7 insures sealing of the insert 7 within the housing, while permitting rotation of the insert 7.

The insert 7 can be externally adjusted, for example, by a screwdriver, engaged in slit 9 of the head 8, to thereby rotate the insert 7 within the bore 6. Upon rotation, the positioning end 19 of the insert 7 will likewise be rotated so that the blade 24 will snap into the screwdriver slot of the adjustment groove 7 of the potentiometer 3. Preferably, a preliminary alignment of the blade 24 with the screwdriver slot in the screw head 4 of the potentiometer is made, but this is not entirely necessary. The funnel-shaped enlargement of the rim of the cup-shaped element 19, as seen at 22 in FIG. 1, insures seating of the insert element on the head 4 of the potentiometer 3.

Manufacturing tolerances and different expansions due to different thermal coefficients of expansion of the various materials used in the housing and within the housing may deflect the center line of the bore 6 from the design position, so that the center line of the insert 7 will no longer be congruent with the longitudinal axis of the adjustment screw of the potentiometer 3; likewise, the spacing between the potentiometer 3 and the inner wall 25 may vary due to differential expansion under heat and/or tolerances. The funnel-shaped edge portion 22 of the positioning portion 19 of the insert, which is movable and adjustable by the cross-joints 17, 18 and/or 14, 14' transverse to its longitudinal axis, as well as the S-shaped resilient intermediate portion 16, permit movement in the longitudinal direction to compensate for tolerances. The positioning portion 19, slipped over, and engaging over the positioning screw 4 of the potentiometer reliably insures that the blade 24 will engage the slit of the positioning screw 4. Due to the cross-joints and the S-shaped intermediate portion 18, 17, 16, 14, 14' of the resilient and resiliently deflectable portions of the insert element 7, the potentiometer can be rotated while being free from excessive pressures or constraining misalignments, thus permitting free adjustment of the potentiometer. The resilient, springy S-shaped intermediate portion 16 can readily be dimensioned to accept any possible pressures which may arise and act longitudinally in the direction of the longitudinal axis of the insert 7. Thus, overloading of the insert element 7 can be readily avoided and excessive pressures on the potentiometer can, likewise, be avoided.

The blade 24 at the positioning portion 19 can be formed with an insertion taper, or insertion assisting surface if the potentiometer is formed with a central slit; the arrangement can, likewise, be used with a recessed slit on the potentiometer in which case, then, the blade 24 can project to the required extent from the end portion 19, and, preferably, is formed with tapered alignment-seeking surfaces.

Various changes and modifications may be made within the scope of the inventive concept.

What is claimed is:

1. Electronic control unit structure having therein an adjustable potentiometer (3), having
    a housing (1) adapted to be sealed with respect to the outside and with respect to environmental influences;
    a circuit board (2) located within the housing at a predetermined position therein;
    the adjustable potentiometer (3) being secured within the housing at a predetermined position therein;
    a circular opening (6) formed in a wall of the housing, aligned with a longitudinal axis of an adjustment portion (4) of the potentiometer, when the potentiometer is located within the housing; and
    an adjustable element (7) passing through said opening in the wall of the housing, and engageable with the adjustment portion (4) of the potentiometer, wherein, in accordance with the invention, the adjustable element (7) comprises
    a unitary insert structure having a plug-like body (11) which is insertable in the opening (6) from the outside of the housing and formed with means (13) for rotatably retaining the insert structure in the wall of the housing, said plug-like body (11) having a longitudinal and rotational axis coinciding with a central axis defined by said circular opening (6);
    an elastic deformable compensating portion (14,14',16,17,18) resiliently deflectable longitudinally and transversely with respect to said axis of the adjustment portion (4) of the potentiometer (3) as well as longitudinally and transversely with respect to the longitudinal axis of the plug-like body (11); and
    means (19-24) for engaging the adjustment portion (4) of the potentiometer, secured to and unitary with said compensating portion (14,14',16,17,18);
    and wherein the elastically deformable compensating portion comprises at least one cross-joint (14, 14', 17, 18) and an essentially S-shaped intermediate portion (16) located between the plug-like body(11) and the means (19-24) for engaging the adjustment portion (4) of the potentiometer (3).

2. Structure according to claim 1 wherein the retaining means (13) comprises at least two snap-hooks (13), resiliently reflectable radially inwardly with respect to the opening, and engageable around the inner wall of the housing.

3. Structure according to claim 1 wherein the means (19-24) for engaging the adjustment portion (4) of the potentiometer (3) comprises an end element (19) formed with inclined locating surfaces, inclined and positioned for self-assisted engagement with the adjustment portion (4) of the potentiometer.

4. Structure according to claim 1 wherein the unitary insert structure comprises an tenacious, resiliently deformable plastic.

5. Structure according to claim 4 wherein said plastic is a polyamide.

6. In combination with an electronic control unit structure having therein an adjustable potentiometer (3), having
    a housing (1) adapted to be sealed with respect to the outside and with respect to environmental influences;
    a circuit board (2) located within the housing at a predetermined position therein;
    the adjustable potentiometer (3) being secured within the housing at a predetermined position therein;
    a circular opening (6) formed in a wall of the housing, aligned with a longitudinal axis of an adjustment portion (4) of the potentiometer, when the potentiometer is located within the housing;
    an adjustable element (7) passing through said opening (6) in the wall of the housing, and engageable with the adjustment portion (4) of the potentiometer, wherein, in accordance with the invention, the adjustable element (7) comprises
    a unitary insert structure having a plug-like body (11) which is insertable in the opening (6) from the outside of the housing and formed with means (13) for rotatably retaining the insert structure in the wall of the housing, said plug-like body (11) having a longitudinal and rotational axis coinciding with a central axis defined by said circular opening (6);
    an elastic deformable compensating portion (14,14',16,17,18) resiliently deflectable longitudinally and transversely with respect to said axis of the adjustment portion (4) of the potentiometer (3) as well as longitudinally and transversely with respect to the longitudinal axis of the plug-like body (11); and
    means (19-24) for engaging the adjustment portion (4) of the potentiometer, secured to and unitary with said compensating portion (14,14',16,17,18);
    and wherein the elastically deformable compensating portion comprises at least one cross-joint (14, 14', 17, 18) and an essentially S-shaped intermediate portion (16) located between the plug-like body

(11) and the means (19-24) for engaging the adjustment portion (4) of the potentiometer (3).

7. Element according to claim 6 wherein the retaining means (13) comprises at least two snap-hooks (13), resiliently deflectable radially inwardly with respect to the opening, and engageable around the inner wall of the housing.

8. Element according to claim 6 wherein the retaining means (13) comprises at least two snap-hooks (13), resiliently reflectable radially inwardly with respect to the opening, and engageable around the inner wall of the housing.

9. Element according to claim 6 wherein the means (19-24) for engaging the adjustment portion (4) of the potentiometer (3) comprises an end element (19) formed with inclined locating surfaces, inclined and positioned for self-assisted engagement with the adjustment portion (4) of the potentiometer.

10. Element according to claim 6 wherein the unitary insert structure comprises an tenacious, resiliently deformable plastic.

11. Element according to claim 10 wherein said plastic is a polyamide.

* * * * *